(12) United States Patent
Lin

(10) Patent No.: US 6,693,359 B1
(45) Date of Patent: Feb. 17, 2004

(54) HIGH DENSITY WIRE BONDING PADS FOR SEMICONDUCTOR PACKAGE

(76) Inventor: Yi-Ching Lin, No. 13, Lane 590, Sec. 4, Jungshing Rd., Judung Jen, Hsinchu (TW)

( * ) Notice: Subject to any disclaimer, the term of this patent is extended or adjusted under 35 U.S.C. 154(b) by 0 days.

(21) Appl. No.: 10/351,328

(22) Filed: Jan. 27, 2003

(51) Int. Cl.[7] .............................................. H01L 23/48
(52) U.S. Cl. ...................... 257/774; 257/778; 257/678; 438/106
(58) Field of Search ................................ 257/678, 684, 257/784, 774, 775, 778; 438/106

(56) References Cited

U.S. PATENT DOCUMENTS

| | | | |
|---|---|---|---|
| 2002/0084533 A1 * | 7/2002 | Pollock et al. | 257/778 |
| 2003/0066679 A1 * | 4/2003 | Castro et al. | 174/255 |

* cited by examiner

*Primary Examiner*—Vanthu Nguyen
*Assistant Examiner*—Brad Smith
(74) *Attorney, Agent, or Firm*—Bacon & Thomas, PLLC

(57) ABSTRACT

A semiconductor package, which is to attach an electric device, such as a die, thereon and electrically connect therewith, has a substrate with a conductor pattern thereon. The conductor pattern consists of a plurality of traces in a specific layout. The conductor pattern has conducting portions on which is provided with a conductor member respectively. The conductor members locate at positions above the conducting portion of the conductor pattern with a bottom surface thereof electrically connecting a top surface of the conducting portion. A solder mask is provided on the substrate sheltering the conductor pattern but exposing at least a top surface of the conductor member. Whereby, the conductor can electrically connect the electric device via the conductor members.

10 Claims, 6 Drawing Sheets

HIGH DENSITY WIRE BONDING PADS FOR SEMICONDUCTOR PACKAGE

BACKGROUND OF THE INVENTION

1. Field of the Invention

The present invention relates generally to a semiconductor device, and more particularly to a semiconductor package with bonding pads thereon using spaces above a conductor pattern.

2. Description of the Related Art

A conventional semiconductor package 90, as shown in FIG. 1 and FIG. 2, has a substrate 91, a conductor pattern 92 consisting of a plurality of copper traces 93 in a specific layout on a side or both sides of the substrate 91 and a solder mask 94 on the substrate 91 and sheltering the conductor pattern 92. The solder mask 94 is removed at specific portions to exposing the predetermined sections of the traces 93 and to plate nickel and gold layers 95 on the exposed surfaces of the traces 93 such that bonding pads 96 are made on the package 90.

Please refer to FIG. 2, the layers 95 will be attached on top surfaces 931 and opposite lateral sides 932 of the exposed traces 93 of the conductor pattern 92. It is quite different to control the thickness of the layers 95 on the lateral sides of the trace 93 in plating such that the pitch of the pads 96 must be kept in a larger distance to prevent electromagnetic interference under a condition of larger thickness of the layers 95 on the lateral surfaces 932 shortening the interval of two pads 96 and to prevent two pads 96 short because of the layers 95 on the lateral surfaces 932 touching each other. Therefore, there will be fewer pads 96 can be arranged on the packages within a predetermined interval.

FIG. 3 and FIG. 4 show the package 90 attaches a die 97 thereon and electrically connects the die 97 with the conductor pattern 92 by wire bonding. Bonding wires 98 (usually are gold wires) bond their both ends to the die 97 and the bonding pads 96 of the package 90.

The pads 96 have to be arranged at a portion far away from the die 97 to get sufficient amounts of the pads 96 for connection therewith. Under such condition, the bonding wires 98 must be longer and the proportion of defective of bonding the wires 98 will be larger. More important, the size of the package 90 is limited to be smaller.

SUMMARY OF THE INVENTION

The primary objective of the present invention is to provide a semiconductor package, which can arrange more pads thereon in a predetermined interval compared with a conventional semiconductor package can.

According to the objective of the present invention, a semiconductor package of the present invention comprises a substrate with a conductor pattern thereon. The conductor pattern has a plurality of conductive traces in a specific layout. The conductor pattern has at least a conducting portion on which is provided with a conductor member. The conductor members locate at positions above the conducting portion of the conductor pattern with a bottom surface thereof electrically connecting a top surface of the conducting portion. A solder mask is provided on the substrate sheltering the conductor pattern but exposing at least a top surface of the conductor member. Whereby, the conductor can electrically connect an electric device, such as a die, via the conductor members.

DETAILED DESCRIPTION OF THE INVENTION

Figure 1:
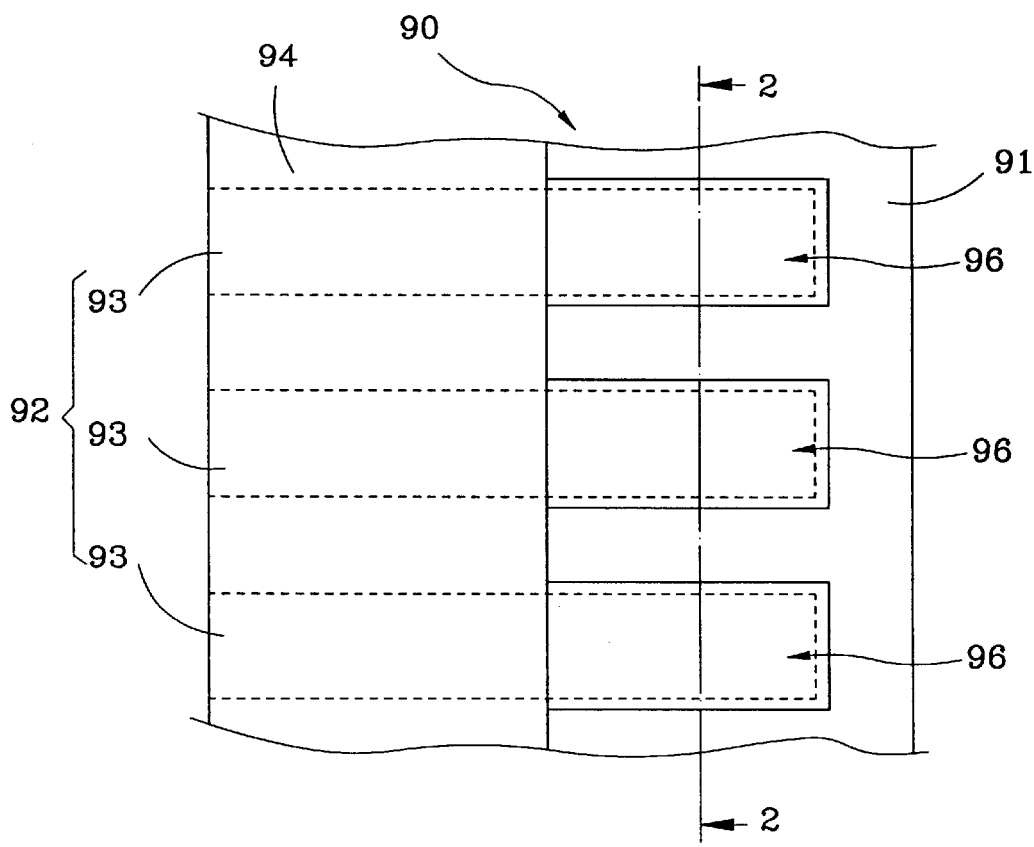
FIG. 1 is a partial top view of a conventional semiconductor package, showing a substrate with a conductor pattern, bonding pads and a solder mask thereon.
Figure 2:
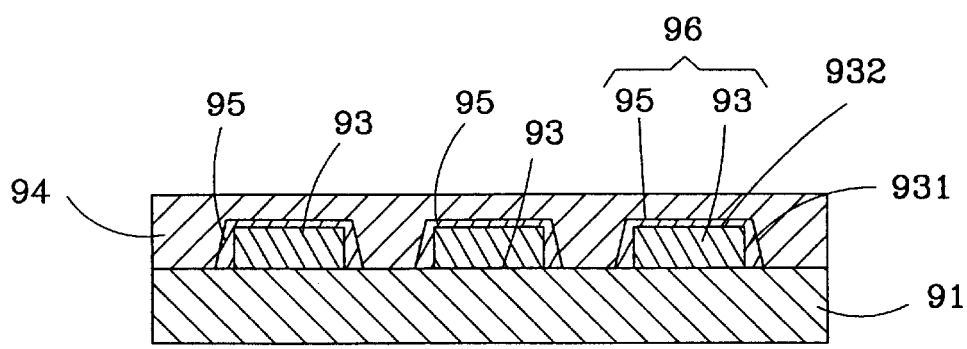
FIG. 2 is a sectional view along a 2—2 line in FIG. 1.

Please refer to FIGS. From FIG. 5 to FIG. 8, a semiconductor package 1 of the first preferred embodiment of the present invention mainly comprises a substrate 10, a conductor pattern 20 consisting of a plurality of copper traces 21 in a specific layout and provided on a side or both sides of the substrate 10, a solder mask 30 provided on the substrate 10 and sheltering the conductor pattern 20 and conducting members 40.

Hereunder we will describe the processes of manufacturing the semiconductor package 1 of the present invention to make one may concern the present invention easy to understand.

Figure 5:
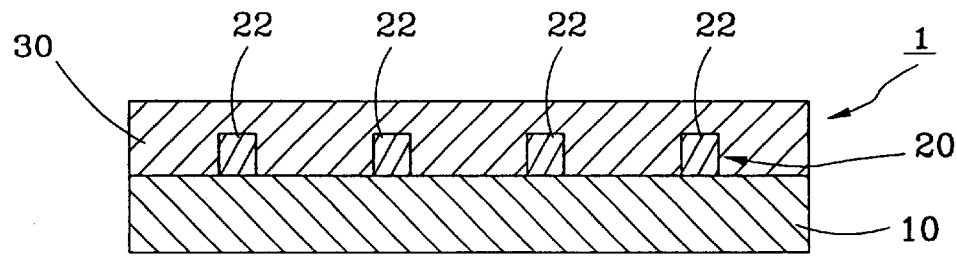
FIG. 5 is a sectional view of a first preferred embodiment of the present invention, showing a substrate with a conductor pattern and a solder mask thereon

First, as shown in FIG. 5, prepare the substrate 10 with the conductor pattern 20 and solder mask 30 thereon. The conductor pattern defines conducting portions 22 at specific portions of the copper traces 21.

Figure 6:
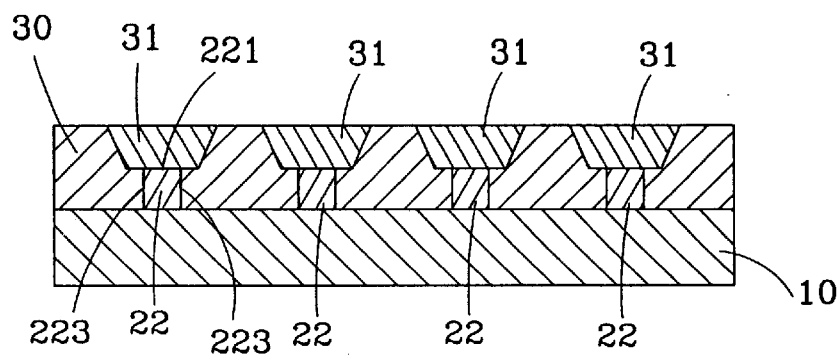
FIG. 6 is a sectional view following FIG. 5, showing the solder mask being conformal opened at positions relating to conducting portions of the conductor pattern.
Figure 7:
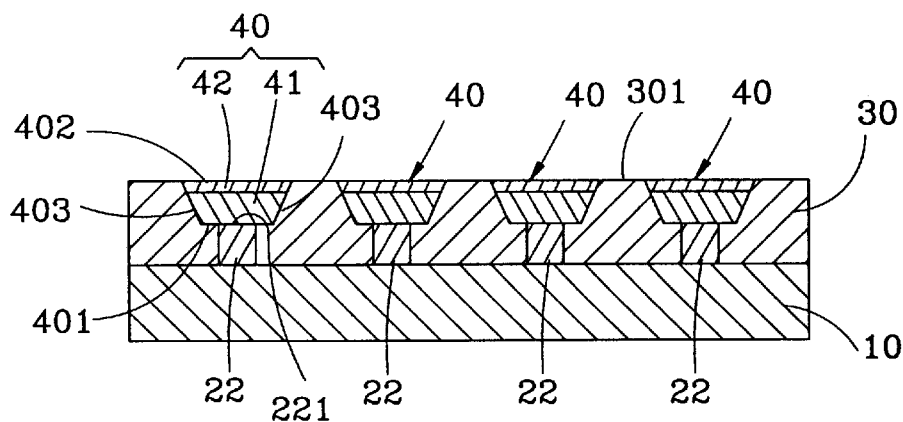
FIG. 7 is a sectional view following FIG. 6, showing conducting members being provided in the vias of the solder mask.
Figure 8:
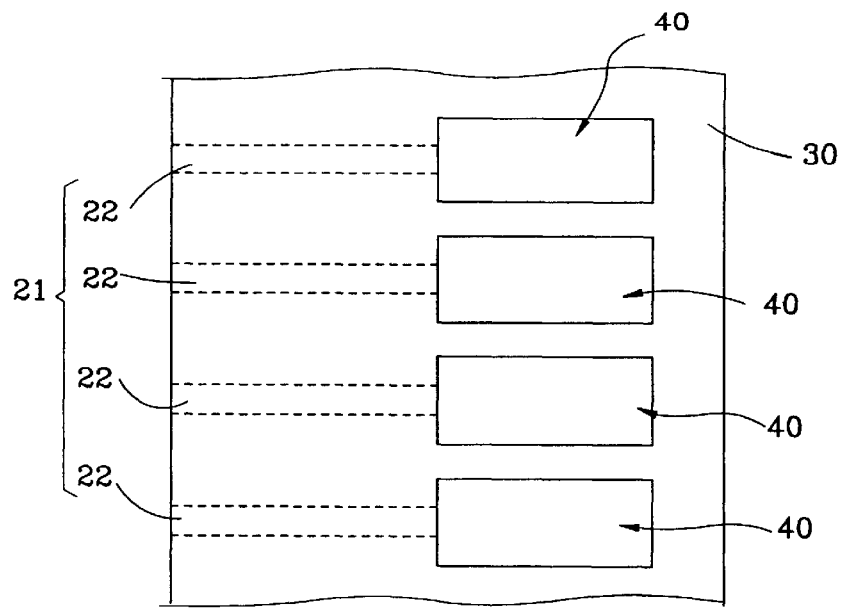
FIG. 8 is a top view of the first preferred embodiment of the present invention.

Second, apply the known photochemical method to remove the solder mask 30 at portions above the conducting portions 22 of the conductor pattern 20. The solder mask 30 is conformal opened in this step to have vias 31 therein to expose the conducting portions 22 respectively. Each conducting portion 22 has a top side 221 exposed via the vias 31 and has lateral sides 223 still sheltered by the solder mask 30 as shown in FIG. 6.

Last, plate conducting members 40 in the vias 31 of the solder mask 30 respectively. Each conducting member 40 has a first layer 41 and a second layer wherein the first layer 41 can be copper, which is as same as the material of the conductor pattern 20, and the second layer 42 can be gold, nickel or gold-nickel. The conducting members 40 also could be just gold, nickel or gold-nickel.

Each conducting member 40 has two lateral sides 403 sheltered by the solder mask 30 and has a bottom side 401 in touch with the top side 221 of the corresponding conducting portion 22 of the conductor pattern 20 and electrical connection therewith. The conducting members 40 each have a top side 402 which locate at a level as same as a top 301 side of the solder mask 30. The heights of the top sides 402 of the conducting members 40, however, could be higher than the top side 301 of the solder mask 30 or lower than the top side 301 of the solder mask 30. It is a choice of the manufacturer.

Figure 9:
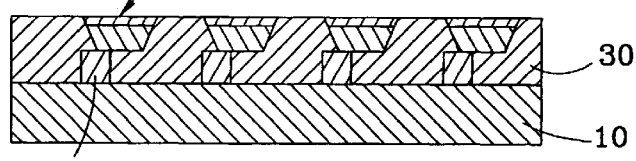
FIG. 9 is a sectional view of the first preferred embodiment of the present invention, showing the conducting members shifting aside for a distance.

In the step of conformal opening the vias 31 via photochemical method or laser shot, there might be a registration error occurred to make the vias 31 shifting aside, as shown in FIG. 9. But it will not affect the semiconductor package of the present invention working, because of when a shifting occurred, which means all of the conducting members 40 will shift a same distance, therefore, it will not affect the process of wire bonding. Again, when all of the conducting members 40 shifting, the intervals between the conducting members 40 still will be kept the same, so it will not occur electromagnetic interference, and further, when the conducting members 40 shifting aside, the distances between the conducting members 40 and the adjacent conducting portions 22 might be shortened, but there is a difference in height between the conducting members 40 and the adjacent conducting portions 22, so they still be kept in a suitable interval.

The main character of the present invention is to provide the conducting members 40 using a space above the conductor pattern 20 to be the pads of the semiconductor package 1. Such that, there is no need to enlarge the interval between two adjacent conducting portions 22 of the conductor pattern 20, which respectively mount the conducting members 40 thereon. The widths of the bottom sides 401 of the conducting members 40 are larger than the width of the relative conducting portions 22 of the conductor pattern 20. The conducting members 40 are isolated by the solder mask 30 so that they will not be contacted with each other, and the intervals therebetween are defined by the vias 31 so that there is no need to precisely control plate the conducting members 40 into the vias 31 respectively.

Figure 3:
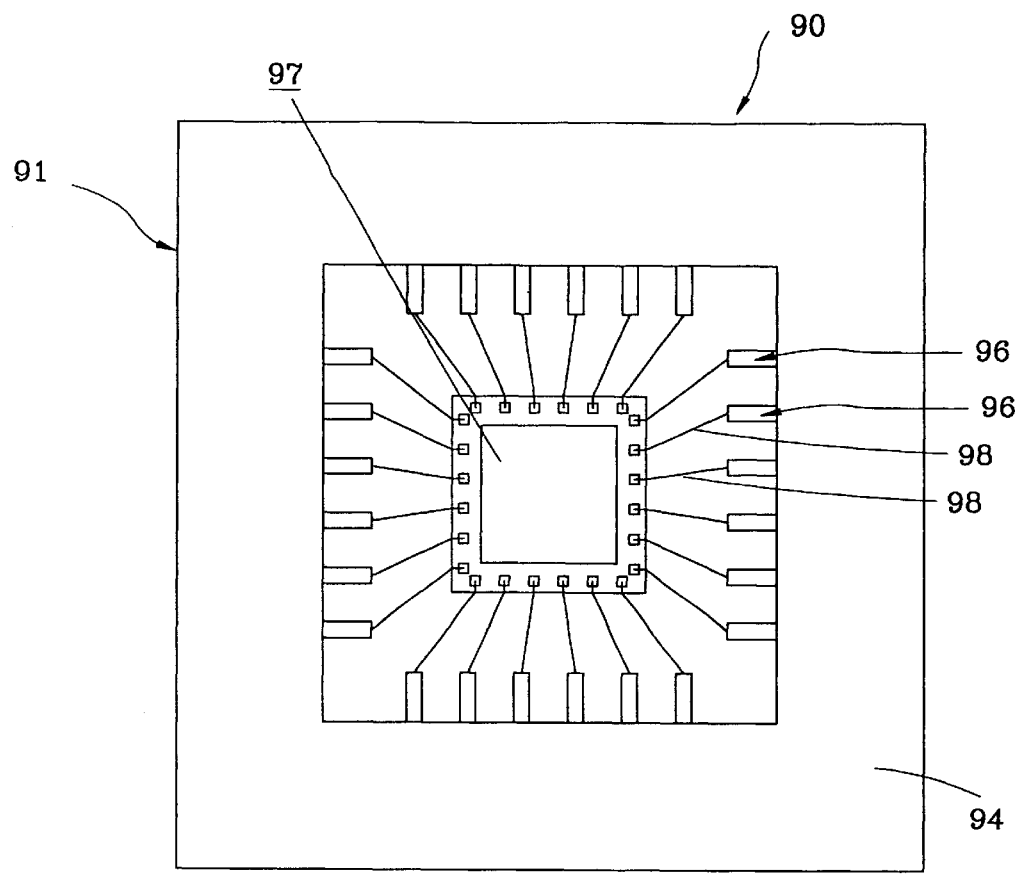
FIG. 3 is a top view of the conventional semiconductor package attaching a die thereon.
Figure 4:
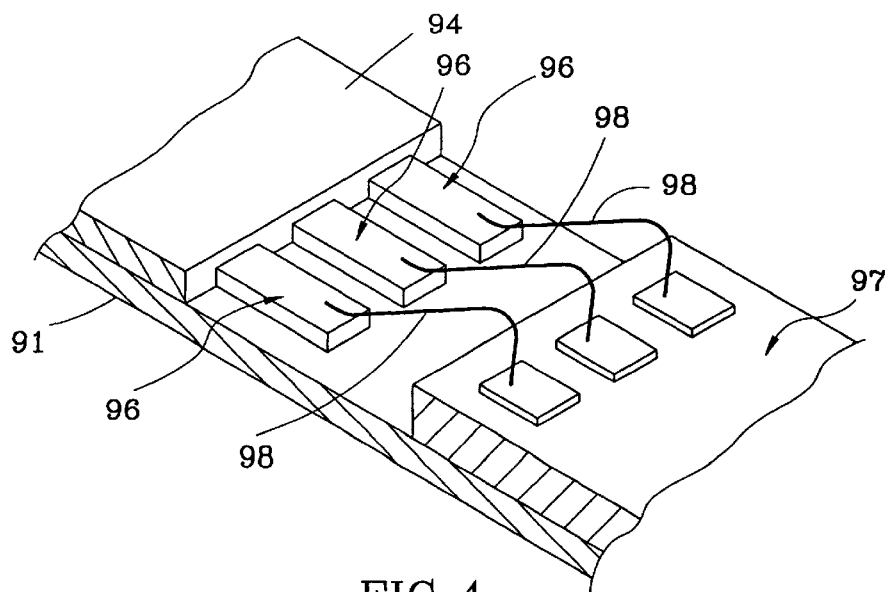
FIG. 4 is a perspective view of the conventional semiconductor package electrically connecting the die via wire bonding.
Figure 10:
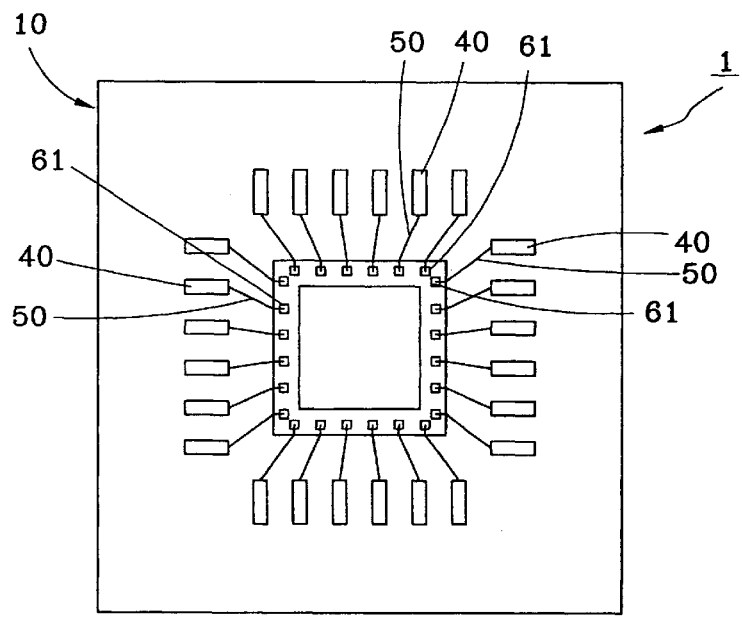
FIG. 10 is a sectional view of the first preferred embodiment of the present invention, showing a die is attached thereon.

FIG. 10 shows a die 60 attached on the semiconductor package 1 of the present invention. As described above, the intervals of the conducting members 40 are smaller than prior art so that we can provide more conducting members 40 in a predetermined interval than the prior art can. Therefore, the conducting members 40 of the present invention can be arranged at a position closer to the die 60, please compare FIG. 10 with FIG. 3. When electrically connect the conducting members 40 and the die 60, the lengths of the gold wires are shortened and the proportion of defective of wire boding is decreased.

Figure 11:
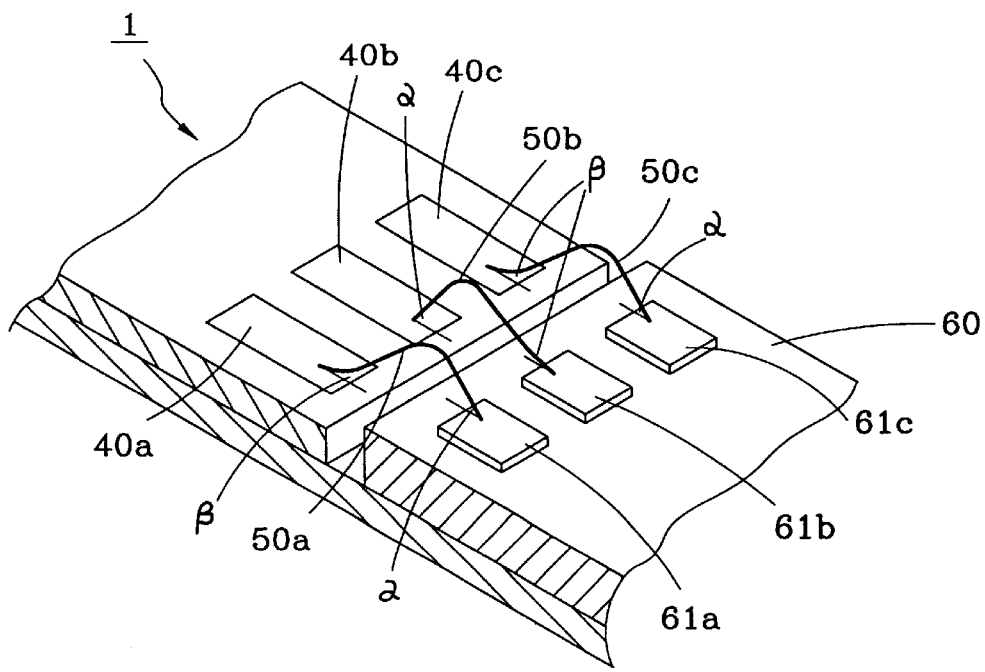
FIG. 11 is perspective view of the first preferred embodiment of the present invention, showing the die being electrically connected with the conductor pattern via the conducting members by wire bonding.

Please refer to FIG. 11, opposite ends of the bonding wires 50 (typical are gold wires) are bonded to the conducting members 40 of the package 1 of the present invention and the die 60 respectively. One binding wire 50a is bonded an end to the conducting members 40a of the package 1 first, and then is bonded the other end to a pad 61a of the die 60. Such circumstance, the conducting members 40a of the package 1 is defined as a first bonding and the pad 61a of the die 60 is defined as a second bonding and the end of the bonding wire bonded on the first bonding is defined as a first bonding end and another end thereof bonded on the second bonding is defined as a second bonding end. Another bonding wire 50b adjacent to the bonding wire 50a is bonded an end thereof to a pad 61b of the die 60 first, and then is bonded the other end thereof to the conducting member 40b, i.e., the pad 61b of the die 60 is a first bonding and the conducting members 40b of the package 1 is second bonding. In the other words, the conducting members 40 of the package 1 of the present invention are defined as the first bonding and the second bonding alternately and the pads 61 of the die 60 are defined as the second bonding and the first bonding alternately. It is very easy to identify which is first bonding and which is second bonding in perspective view. An end of a bonding wire 50 is bonded on a first bonding will have a larger included angle a between the orientation of the bonding wire 50 and a surface of the first bonding and an end of a wire is bonded to a second bonding will have a smaller included angle β. It will shorten the working distance of equipment for the wire bonding process.

In the step of conformal opening the vias 31, typically by plasma etching or by dry film, each vias 31 will have a larger top side and a smaller bottom side. Therefore, the area of the top side 402 of the conducting member are larger for facilitating bonding the bonding wire 50 thereon.

Figure 12:
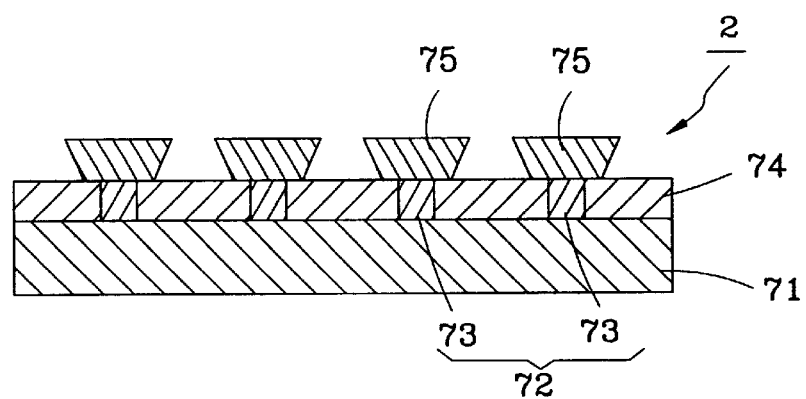
FIG. 12 is a sectional view of a second preferred embodiment of the present invention.

Please refer to FIG. 12, a semiconductor package 2 of the second preferred embodiment of the present invention, which is similar to the first preferred embodiment, mainly comprises a substrate 71, a conductor pattern 72 having a plurality of conducting portions 73, a solder mask 74 and a plurality of conducting members 75. The solder mask 74 is removed its surface by scrubbing or by etching to expose top sides of the conducting portions 73 of the conductor pattern 72. And then, plate the conducting member 75 on the conducting portions 73 respectively.

Of course, it could conformal open vias (not shown) in the solder mask 74 to expose the conducting portions 73, and then plate the conducting members 75 in the vias respectively, at least, remove the solder mask 74 above the conducting portions 73 to be as shown in FIG. 12.

Figure 13:
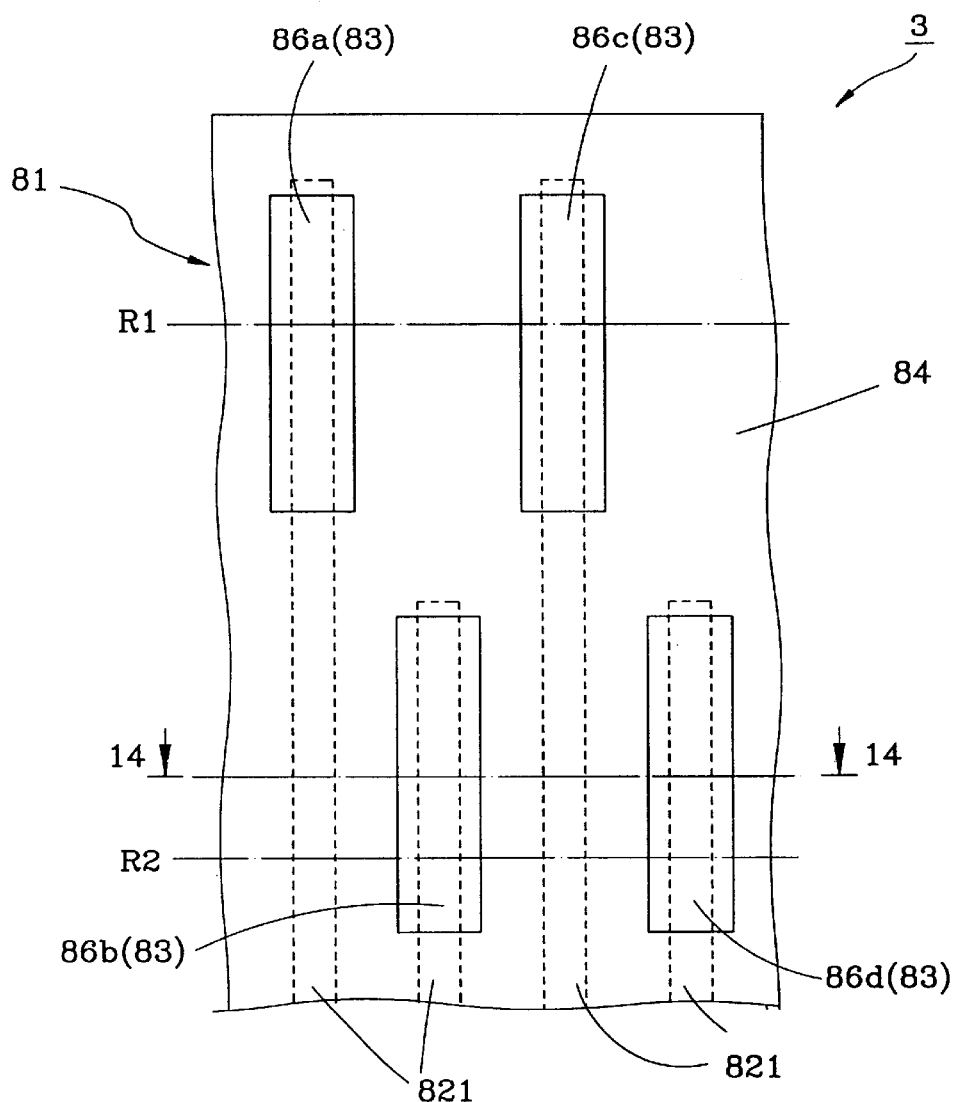
FIG. 13 is a top view of a third preferred embodiment of the present invention.
Figure 14:
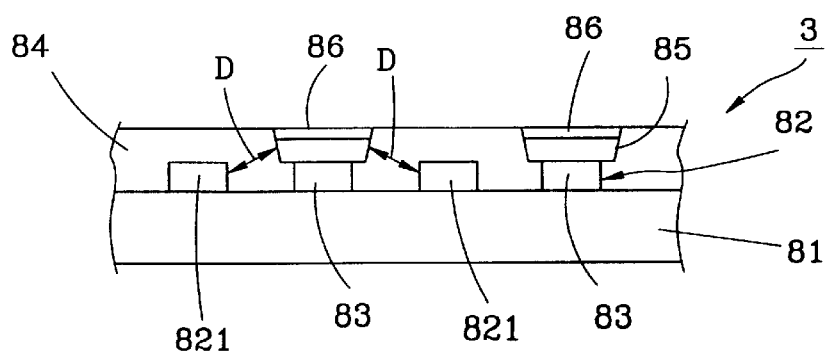
FIG. 14 is a sectional view along a 14—14 line in FIG. 13.

Please refer to FIG. 13 and FIG. 14, a semiconductor package 3 of the third preferred embodiment of the present invention comprises a substrate 81, a conductor pattern 82 having a plurality of conducting portions 83, a solder mask 84 having vias 85 to expose the conducting portions 83 respectively and conducting members 86 plated in the vias 85 respectively. The conducting members 86 are substantially arranged at two rows R1 and R2 in alternation. In the other words, one conducting member 86a is arranged at the first row R1, the next conducting member 86c is arranged at the second row R2, and the next conducting member 86a is arranged at the first row R1 again. It is easy to identify which are arranged at the first row R1 and which are arranged at the second row R2, please refer to FIG. 13, the distances between the conducting members 86a and 86c arranged at the first row R1 are substantially equal and the distances between the conducting members 86b and 86d arranged at the second row R2 are substantially equal too, but the distances between the conducting members 86a and 86c of the first row R1 are significantly different from the distances between the conducting members 86b and 86d of the second row R2 and the conducting members 86 at the first and the second row R1 and R2 are not overlapped along the orientation of the rows.

The widths of the conducting members 86 can be enlarged more in same pads pitch but without electromagnetic interference. Please refer to FIG. 14, the nearest distance between two conducting element is the distance between a conducting member 86 and the next copper trace 821, shown as a bevel line D in FIG. 14, therefore, the height different will be helpful to prevent electromagnetic interference.

The characters and advantages of the present invention are that the conducting members are provided at positions above the conductor pattern that can decrease the pad pitch to make the semiconductor pattern can arrange more conducting members within a same interval so that the distance between the conducting members of the semiconductor package of the present invention and a die bonded thereon will be shorten. Except that, because of the conducting members locate at higher place so that it will get a shorter distance between them and the die. So that the gold wires bonding the conducting members and the die are short. With the third preferred embodiment of the present invention, it will get wider conducting members within same interval.

What is claimed is:

1. A semiconductor package, on which at least an electric device is adapted to be attached and the electric device is electrically connected to the semiconductor package by wire bonding, comprising:

a substrate;

a conductor pattern having a plurality of traces in a specific layout provided on said substrate, wherein said conductor pattern has conducting portions, each of which has a top side and two lateral sides and is arranged around the electric device;

conducting members bonded on said conductor pattern at where above said conducting portions respectively;

wherein each of said conducting members have a bottom side and a top side and at least parts of said bottom sides of said conducting members are mechanically and electrically bonded on said top sides of said conducting portions respectively, and a solder mask provided on said substrate and sheltering said conductor pattern, wherein said solder mask shelters said lateral sides of said conducting portions of said conductor pattern and exposes said top sides of said conducting members whereby said conductor pattern can be electrically connected with the electric device via said conducting members by wire bonding.

2. The semiconductor package as defined in claim 1, wherein said solder mask is provided with vias therein respectively relative to said conducting portions of said conductor pattern and said conducting members are provided in said vias respectively.

3. The semiconductor package as defined in claim 2, wherein said conducting is members are filled in said vias respectively.

4. The semiconductor package as defined in claim 1, wherein a width of said top side of said conducting member is larger than a width of said bottom side thereof.

5. The semiconductor package as defined in claim 1, wherein said conducting members are arranged at at least two rows respectively, wherein said conducting member at same row have substantially same distance between them and the electric device and said conducting member at different rows have significant different distances between them and the electric device and the next two of said conducting members are arranged at different rows.

6. The semiconductor package as defined in claim 5, wherein the next two of said conducting members without any part of them are overlapped along a row's orientation.

7. The semiconductor package as defined in claim 1, wherein said top side of said conducting member has a part extruded from said lateral side of said conducting portion along a width's orientation.

8. The semiconductor package as defined in claim 1, wherein a width of said top side of said conducting members is larger than a width of said top side of said relative conducting portion.

9. The semiconductor package as defined in claim 1, wherein a width of said bottom side of said conducting members is larger than a width of said top side of said relative conducting portion.

10. The semiconductor package as defined in claim 1, further comprising bonding wires bonding both ends thereof on said top sides of said conducting members of the semiconductor package and the die respectively, wherein each of said bonding wires have a first bonding end and a second bonding end wherein one of said bonding wire bonds said first bonding end thereof on one said conducting member and bonds said second bonding end thereof on the die and said next bonding wire bonds said first bonding end thereof on the die and bonds said second bonding end thereof on said next conducting member of the semiconductor package.

\* \* \* \* \*